US 6,723,635 B1

(12) United States Patent
Ngo et al.

(10) Patent No.: US 6,723,635 B1
(45) Date of Patent: Apr. 20, 2004

(54) PROTECTION LOW-K ILD DURING DAMASCENE PROCESSING WITH THIN LINER

(75) Inventors: Minh Van Ngo, Fremont, CA (US); Christy Mei-Chu Woo, Cupertino, CA (US); Steven C. Avanzino, Cupertino, CA (US); John E. Sanchez, Jr., Palo Alto, CA (US); Suzette K. Pangrle, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/115,245

(22) Filed: Apr. 4, 2002

(51) Int. Cl.[7] .................. H01L 21/4763; H01L 21/44
(52) U.S. Cl. .................. 438/627; 438/643; 438/653
(58) Field of Search .................. 438/622, 626–629, 438/631, 633, 643, 644, 648, 649, 653, 656, 657, 719, 753; 257/751–754, 758–763, 774

(56) References Cited

U.S. PATENT DOCUMENTS

| 6,147,407 | A | * | 11/2000 | Jin et al. ............ 257/758 |
| 6,284,657 | B1 | * | 9/2001 | Chooi et al. ........ 438/687 |
| 6,429,129 | B1 | * | 8/2002 | Han et al. ........... 438/688 |
| 6,551,919 | B2 | * | 4/2003 | Venkatesan et al. ... 438/622 |

* cited by examiner

Primary Examiner—Hung Vu

(57) ABSTRACT

Low-k ILDs are protected from degradation during damascene processing by depositing a thin, conformal silicon carbide liner with a silicon-rich surface before barrier metal layer deposition. Embodiments include forming a dual damascene opening in porous low-k dielectric layers, depositing a thin silicon carbide liner with a silicon-rich surface lining the opening, depositing a barrier metal layer, such as a Ta/TaN composite, and filling the opening with Cu.

15 Claims, 4 Drawing Sheets

US 6,723,635 B1

PROTECTION LOW-K ILD DURING DAMASCENE PROCESSING WITH THIN LINER

TECHNICAL FIELD

The present invention relates to semiconductor devices exhibiting reduced capacitance loading and to enabling methodology. The present invention has particular applicability in manufacturing high density, multi-level semiconductor devices comprising sub-micron dimensions and exhibiting high circuit speed.

BACKGROUND ART

Interconnection technology is constantly challenged to satisfy the ever increasing requirements for high density and performance associated with ultra large scale integration semiconductor devices. The speed of semiconductor circuitry varies inversely with the resistance (R) and capacitance (C) of the interconnection system. The higher the value of the R×C product, the more limiting the circuit speed. As integrated circuits become more complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes, e.g., less than about 0.12 micron. The rejection rate due to integrated circuits speed delays in sub-micron regimes has become a limiting factor in fabrication.

The dielectric constant of materials currently employed in the manufacture of semiconductor devices for an inter-layer dielectric (ILD) ranges from about 3.9 for dense silicon dioxide to over 8 for deposited silicon nitride. The value of the dielectric constant expressed herein is based upon a value of one for a vacuum. In an effort to reduce interconnect capacitance, dielectric materials with lower values of permitivity have been explored. The expression "low-k" material has evolved to characterize materials with a dielectric constant less than about 3.9. One type of low-k material that has been explored are a group of flowable oxides which are basically ceramic polymers, such as hydrogen silsesquioxane (HSQ). There are several organic low-k materials, typically having a dielectric constant of about 2.0 to about 3.8, which may offer promise for use as an ILD. Organic low-k materials which offer promise are carbon-containing dielectric materials such as FLARE 20™ dielectric, a poly (arylene) ether, available from Allied Signal, Advanced Micromechanic Materials, Sunnvale, California, Black-Diamond™ dielectric available from Applied Materials, Santa Clara, Calif., BCB (divinylsiloxane bis-benzocyclobutene) and Silk™ dielectric, an organic polymer similar to BCB, both available from Dow Chemical Co., Midland, Mich. Another example is porous, low density materials in which a significant fraction of the bulk volume contains air. The properties of these porous materials are proportional to their porosity. For example, at a porosity of about 80%, the dielectric constant of a porous silica film, i.e. porous $SiO_2$, is approximately 1.5.

Copper (Cu) and Cu alloys have received considerable attention as alternative metallurgy to aluminum (Al) in interconnect metallizations. Cu is relatively inexpensive, easy to process, and has a lower resistively than Al. In addition, Cu has improved electrical properties vis-à-vis tungsten (W), making Cu a desirable metal for use as a conductive plug as well as conductive wiring. However, due to Cu diffusion through dielectric materials, such as silicon dioxide, Cu interconnect structures must be encapsulated by a diffusion barrier layer. Typical diffusion barrier materials include tantalum (Ta), tantalum nitride (TaN), titanium (Ti), titanium nitride (TiN), tintanium-tungsten (TiW), Tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the ILD, but includes interfaces with other metals as well.

Cu interconnect technology, by and large, has been implemented employing damascene techniques, wherein an ILD, such as a silicon oxide layer, e.g., derived from tetraethyl orthosilicate (TEOS) or silane, or a low-k material, is formed over an underlying metal level containing metal features, e.g., Cu or Cu alloy features with a silicon nitride capping layer. A damascene opening, e.g., via hole, trench, or dual damascene opening, is then formed in the ILD. A barrier layer and optional seedlayer are then deposited, followed by Cu deposition, as by electrodeposition or electroless deposition.

In attempting to implement Cu interconnects with low-k dielectric materials, particularly porous low-k dielectric materials, problems have been encountered. For example, it found that degradation of the low-k material occurred during deposition of a barrier metal layer prior to filling a damascene opening with Cu. Such degradation typically includes an undesirable increase in the dielectric constant.

There exists a need for methodology enabling the use of low-k dielectric materials, particularly porous low-k dielectric materials, in fabricating high density, multi-level interconnection patterns based on Cu. There exists a particular need for methodology enabling the use of such low-k materials while avoiding their degradation during interconnect fabrication.

DISCLOSURE OF THE INVENTION

An advantage of the present invention is a semiconductor device having interconnect patterns exhibiting reduced parasitic R×C time delays employing dielectric materials having a low dielectric constant.

Another advantage of the present invention is a method of manufacturing a semiconductor device having interconnect patterns exhibiting reduced parasitic R×C time delays employing dielectric materials having a low dielectric constant.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a dielectric layer having an upper surface over a conductive feature; forming an opening in the dielectric exposing an upper surface of the conductive feature; forming a silicon carbide layer having a silicon surface, lining the opening; depositing a barrier layer on the silicon surface of the silicon carbide layer; and filling the opening with copper (Cu) or a Cu alloy.

Another aspect of the present invention is a semiconductor device comprising: a dielectric layer formed over a conductive feature having an upper surface; an opening in the dielectric layer over the upper surface of the conductive feature; a silicon carbide layer having a silicon surface region lining the opening; a diffusion barrier layer on the silicon surface region of the silicon carbide layer and in contact with the upper surface of the conductive feature; and copper (cu) or a Cu alloy filling the opening.

Embodiments of the present invention include forming a dual damascene opening in low-k dielectric materials, such as porous low-k dielectric materials, depositing the silicon carbide layer with silicon surface lining the opening, on the upper surface of the underlying conductive feature, and on the upper surface of the uppermost dielectric layer. Reverse physical sputtering or sputter etching is then conducted to remove the silicon carbide layer from the upper surface of the uppermost dielectric layer and from the upper surface of the underlying conductive feature. A barrier layer is then deposited, such as a composite comprising a layer of tantalum nitride with a layer of alpha-tantalum thereon. A seedlayer can then be deposited followed by filling the opening, as by electrodedeposition or electrodeless deposition, with Cu. Chemical mechanical polishing (CMP) is then conducted to form a planarized upper surface, followed by deposition of a capping layer, such as silicon carbide or silicon nitride.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded and illustrative in nature, and not as restrictive.

BRIEF DESCRIPTION OF THE DRAWINGS

In FIGS. 1 through 4, similar features are devoted by similar reference characters.

DESCRIPTION OF THE INVENTION

Figure 1:
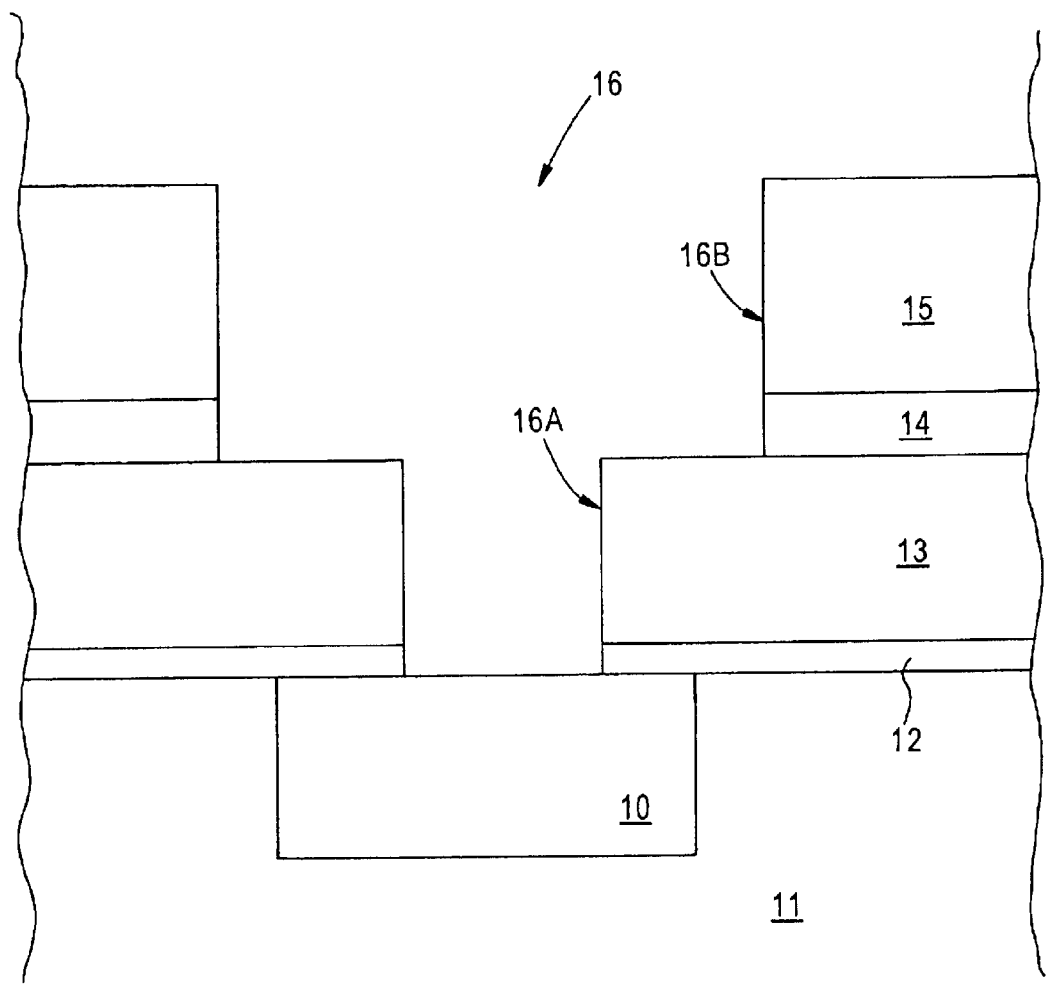
FIGS. 1 through 4 schematically illustrate sequential phases of a method in accordance with an embodiment of the present invention.

The present invention addresses and solves problems attendant upon fabricating multi-layer interconnect devices, particularly parasitic R×C time delays. The capacitance, both layer-to-layer and within-layer, is primarily attributed to the film properties of the ILD. The present invention enables efficient implementation of multi-level interconnect technology using various low-k dielectric materials for ILDs, such as porous low-k dielectric materials, without or with significantly reduced degradation of the dielectric materials. The present invention is particularly applicable to low-k dielectric materials, particularly porous low-k dielectric materials without degradation thereof, during Cu damascene techniques, as during barrier metal layer deposition. As employed throughout this disclosure, the symbol Cu is intended to encompass high purity elemental copper as well as copper-based alloys, such as copper alloys containing minor amounts of tantalum indium, tin, zinc, manganese, titanium, germanium, ziconium, strontium, palladium, magnesium, chromium and tantalum.

Experiments and investigations were initially conducted to develop ways to protect low-k dielectric from degradation during barrier metal layer deposition when implementing Cu interconnect technology. Initial attempts focused on providing a silicon nitride liner. However, it was difficult to deposit an extremely thin silicon nitride film in a comformable manner. Moreover, silicon nitride exhibits an undesirably high dielectric constant, which is antithetic to the demands for increased operating speed.

After continued experimentation and investigation, it was found that an extremely thin silicon carbide liner can be deposited to effectively protect low-k dielectric materials, particularly porous low-k dielectric materials, from degradation during damascene processing. It was found that the use of a silicon carbide liner to protect low-k materials from degradation offers various advantages. For example, it was found that silicon carbide can be deposited at an extremely low deposition rate, e.g., about 50% lower than the deposition rate of silicon nitride. Such a low deposition rate enables the deposition of an extremely thin layer with superior process control. In addition, the low deposition rate enables superior conformability and step coverage. It was found that the conformability of a layer of silicon carbide is at least 30% better in step coverage than that of silicon nitride. Further, silicon carbide exhibits a lower dielectric constant, e.g., 4.5 to 5.0, vis-à-vis silicon nitride with a dielectric constant over 8.

Embodiments of the present invention comprise depositing an ultra thin layer of silicon carbide, e.g., at a thickness of about 20 Å to about 70 Å, and then forming a silicon-rich, i.e., a silicon surface region, on the silicon carbide layer. Advantageously, the silicon surface region improves adhesion of the barrier layer.

Embodiments of the present invention comprise forming a dual damascene opening in first and second low-k dielectric layers with a middle etch stop layer therebetween, such as silicon nitride or silicon oxynitride. The low-k dielectric materials can comprise any various low-k dielectric materials, particularly porous low-k materials, typically having a porosity of about 10% to about 20%. A dual damascene opening can be formed by conventional trench first-via last technique or a conventional via first-trench last technique. After forming the dual damascene opening, the wafer containing the dielectric layers is placed into a chamber, such as an AMAT Producer. Initially, trimethyl silane (TMS) and helium (He) are introduced into the chamber. The TMS flow rate is stabilized at about 100 to about 200 sccm, and the He flow rate is stabilized at about 100 to about 1,000 sccm.

It is found particularly advantageous to delay the introduction of ammonia ($NH_3$), to avoid damaging the low-k dielectric materials at the beginning of the deposition cycle. It was found that a delay of about 5 to about 35 seconds, e.g., about 20 seconds, is sufficient to stabilize the flow rates of TMS and He and prevent degradation prior to introducing $NH_3$ into the chamber. The RF power is then turned on, at about 240 to about 360 watts, e.g., about 300 watts, and $NH_3$ is introduced into the chamber and stabilized at a flow rate of about 200 to about 600 sccm. The pressure is typically maintained at about 2 to about 4 Torr, while the temperature is typically maintained at about 300° C. to about 360° C. Plasma enhanced chemical vapor deposition (PECVD) is conducted to deposit a flash silicon carbide layer, as at a thickness of about 20 Å to about 70 Å. The introduction of all gases is then discontinued, and the RF power is reduced to about 120 to 180 watts, e.g., about 150 watts. At this point, silane ($SiH_4$) is introduced and stabilized at a flow rate of about 50 to about 200 sccm, to deposit a uniform, ultra thin silicon layer of about 10 Å to about 20 Å. Subsequently, the introduction of $SiH_4$ is discontinued and the power is shut off.

Sputter etching or reverse physical sputtering is then conducted to remove the silicon carbide layer from the upper surface of the uppermost dielectric layer and from the upper surface of the underlying conductive or metal feature, thereby creating a sidewall spacer of silicon carbide with a silicon surface.

A wide variety of low-k materials can be employed as an ILD in accordance with embodiments of the present invention, including various polyimides, BCB, FLARE™, Silk™, and Black-Diamond™ dielectrics. Other suitable low-k dielectrics include poly(arylene)ethers, poly(arylene) ether azoles, parylene-N, polyimides, polynapthalene-N, polyphenyl-quinoxalines (PPQ), polyphenyleneoxide, polyethylene, polypropylene and SiCOH which exhibits a dielectric constant of about 3 and contains SiC, SiH, CH and SiOH bonding. Other suitable low-k dielectric materials include fluorosilicate glass (FSG or SiOF), hydrogenated diamond-like carbon (DLC), polystyrene, fluorinated polyimides, parylene (AF-4), polyarylene ether, and polytatrafluoro ethylene. The present invention advantageously enables the use of porous low-k dielectric materials, such as siloxanes, silsesquioxanes, aerogels, and xerogels, typically having a porosity of about 10 to about 20%, without degradation during barrier metal layer deposition.

A method in accordance with an embodiment of the present invention is schematically illustrated in FIGS. 1 through 4, wherein like features are denoted by like reference numerals. Adverting to FIG. 1, reference numeral 10 denotes a lower metal feature formed in interlayer dielectric (ILD) 11 overlying a substrate of a wafer (not shown). ILD 11 may comprise any conventional dielectric material, such as a low-k dielectric material. Lower conductive feature 10, may be a Cu line.

With continued reference to FIG. 1, a capping layer 12, such as silicon carbide, is formed over ILD 11 and Cu line 10. First 13 and second 15 low-k dielectric layers are formed with a middle etch stop layer 14 there between. First and second ILDs 13, 15, may be formed of porous low-k dielectric materials, while middle etch stop layer 14 can be formed of silicon nitride or silicon oxynitride. A dual damascene opening 16 is then formed comprising lower via hole section 16A in first dielectric layer 13 and trench section 16B in second dielectric layer 15.

Figure 2:
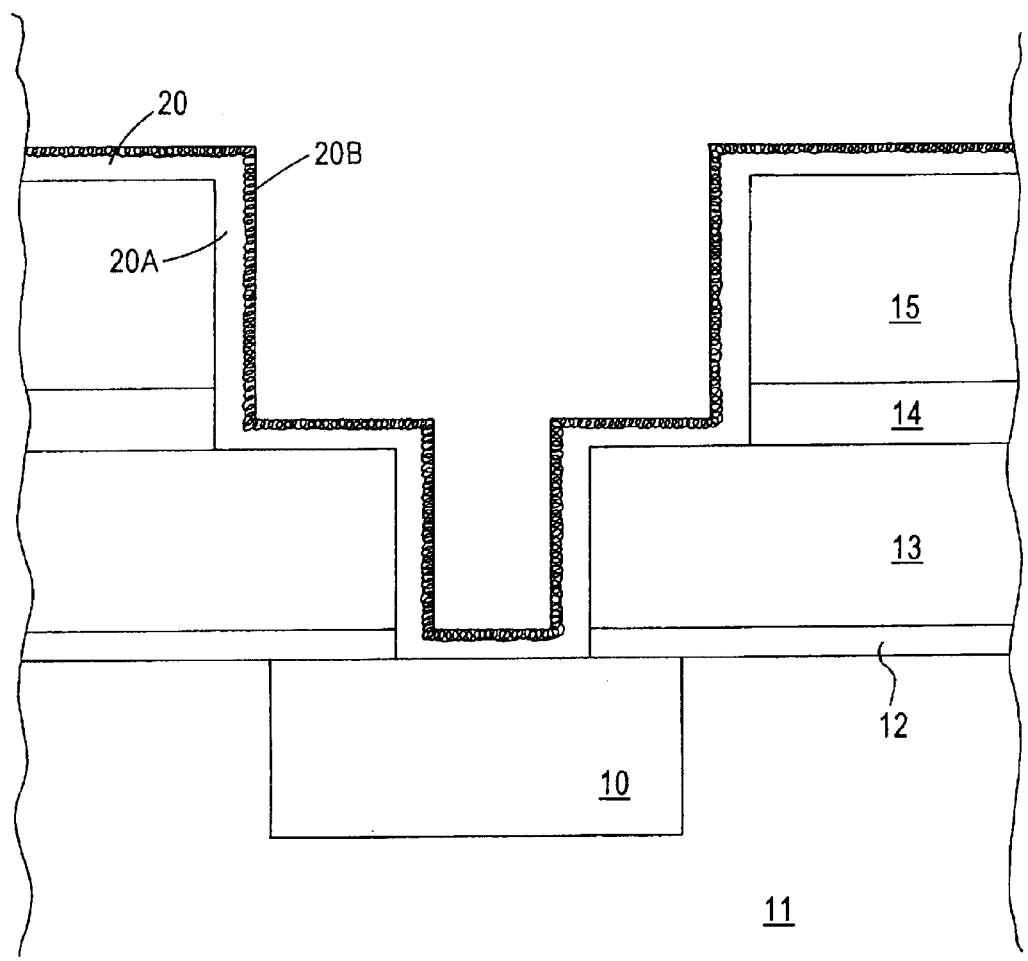

Adverting to FIG. 2, PECVD is implemented to form deposit layer 20 comprising a silicon carbide layer 20A, as at a thickness of about 20 Å to about 70 Å, and a silicon surface region 20B thereon, as at a thickness of about 10 Å to about 20 Å.

Figure 3:
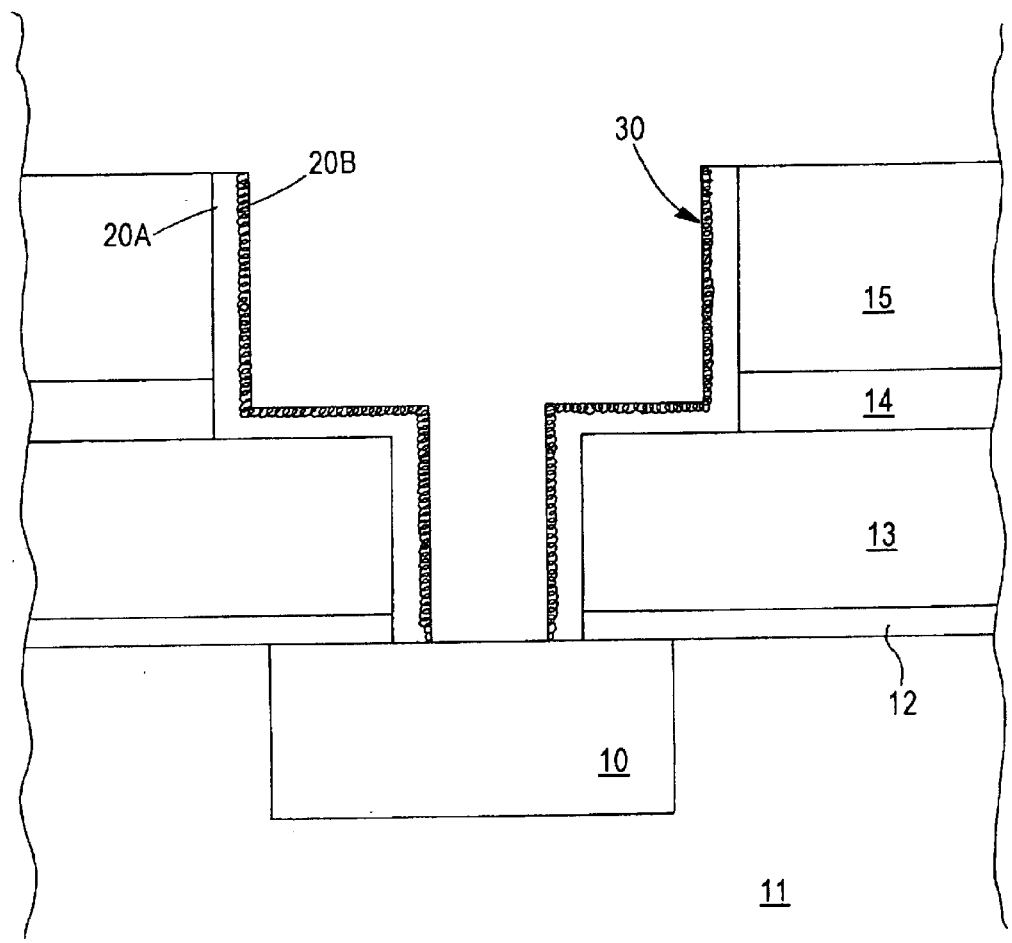

Reverse physical sputtering or sputter etching is then conducted to remove layer 20 from the upper surface of dielectric layer 15 and from the upper surface of metal line 10 to form a sidewall spacer 30 lining the dual damascene opening 16 as illustrated in FIG. 3. Sidewall spacer 30 comprises the silicon carbide layer 20A and silicon surface region 20B.

Figure 4:
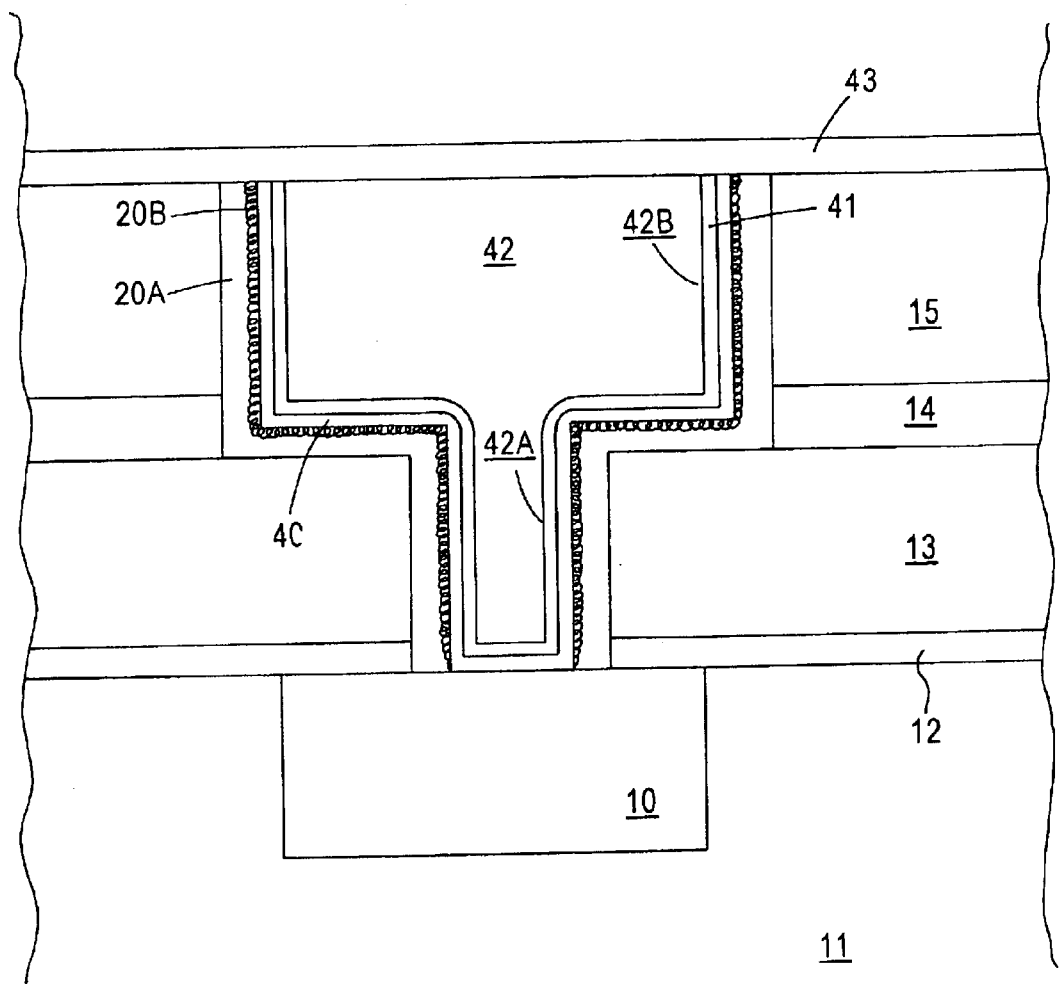

Adverting to FIG. 4, subsequent damascene processing is then conducted as by depositing a barrier layer 40, such as a composite comprising a layer of tantalum nitride and a layer of α tantalum thereon, and depositing a seedlayer 41. Typical seedlayers include Cu alloys containing magnesium, aluminum, zinc, zirconium, tin, nickel, pallandium, silver or gold in a suitable amount, e.g., about 0.3 to about 12 at. %.

Cu is then deposited, as by electrodeposition or electroless deposition, followed by CMP to remove an overburden. A capping layer 43, such as silicon carbide or silicon nitride, is then deposited resulting in the structure schematically illustrated in FIG. 4. Advantageously, the formation of sidewall spacer 30 (FIG. 3) comprising silicon carbide layer 20B and silicon surface region 20A therein prevents degradation to the low-k dielectric layers 13 and 15 during barrier layer deposition and seals off the pores to prevent barrier layer deposition inside the pores of porous low-k materials. Sidewall spacer 30 can be deposited in a highly conformable manner at a significantly low thickness with a high degree of process control.

The present invention enables fabricating semiconductor devices having multi-level interconnect patterns based upon Cu and low-k dielectric materials, particularly porous low-k dielectric materials, without degradation thereof during damascene processing by strategically forming an ultra thin protective layer of silicon carbide with a silicon surface region therein. The semiconductor devices exhibit improved dimensional accuracy, increased operating speed and improved reliability.

The present invention enjoys industrial applicability in manufacturing highly integrated semiconductor devices exhibiting increased circuit speed. The present invention enjoys particular applicability in fabricating semiconductor devices with sub-micron dimensions, e.g., with a design rule of about 0.12 microns and under.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a dielectric layer having an upper surface over a conductive feature;

forming an opening in the dielectric layer exposing an upper surface of the conductive feature;

forming a silicon carbide layer, having an upper silicon surface, lining the opening;

depositing a barrier layer on the upper silicon surface of the silicon carbide layer; and filling the opening with copper (Cu) or a Cu alloy.

2. The method according to claim 1, comprising:

forming the dielectric layer by depositing a first dielectric layer, depositing a middle etch stop layer on the first dielectric layer and depositing a second dielectric layer on the middle etch stop layer; and forming the opening as a dual damascene opening comprising a lower via hole section in the first dielectric layer and upper trench section in the second dielectric layer.

3. The method according to claim 2, comprising forming the silicon carbide layer having the upper silicon surface lining the opening by:

depositing the silicon carbide layer having the upper silicon surface over an upper surface of the second dielectric layer, lining the opening and on the upper surface of the conductive feature; and removing the silicon carbide layer from over the second dielectric layer and from on the upper surface of the conductive feature, leaving the silicon carbide layer having the upper silicon surface lining the trench section and via hole section.

4. The method according to claim 2, comprising forming the silicon carbide layer having the upper silicon surface at a thickness of 30 Å to 90 Å.

5. The method according to claim 4, comprising forming the silicon carbide layer having the upper silicon surface, such that the upper silicon surface has a thickness of 10 Å to 20 Å.

6. The method according to claim 2, comprising forming the silicon carbide layer having the upper silicon surface by sequentially:

introducing a wafer having the dielectric layer with the dual damascene opening therein into a chamber;

introducing trimethyl silane (TMS) and helium (He) into the chamber for a period of time sufficient to stabilize the TMS flow rate at 100 to 200 sccm and to stabilize the He flow rate at 100 to 1,000 sccm;

introducing ammonia ($NH_3$) to establish a flow rate of 200 to 600 sccm;

applying an RF power of 240 to 360 watts to initiate plasma enhanced chemical vapor deposition (PECVD) of the silicon carbide layer;

discontinuing the introduction of TMS, He and $NH_3$ into the chamber;

reducing the RF power to 120 to 180 watts; and introducing silane ($SiH_4$) into the chamber to deposit a layer of silicon on the silicon carbide layer to form the silicon surface.

7. The method according to claim 6, comprising introducing TMS and He into the chamber for about 5 to about 35 seconds before introducing $NH_3$ into the chamber.

8. The method according to claim 6, comprising: depositing the of silicon carbide layer at a thickness of 20 Å to 70 Å; and depositing the layer of silicon at a thickness of 10 Å to 20 Å to form the silicon surface.

9. The method according to claim 6, comprising introducing $SiH_4$ into the chamber to establish a flow rate of 50 to 200 sccm.

10. The method according to claim 2, wherein each of the first and second dielectric layers comprises a dielectric material having a dielectric constant (k) no greater than 3.9.

11. The method according to claim 10, where each of the first and second dielectric layers comprises the dielectric material with a porosity of about 10% to about 20%.

12. The method according to claim 1, comprising forming the silicon carbide layer having the upper silicon surface by depositing the silicon carbide layer and depositing a layer of silicon thereon.

13. The method according to claim 12, comprising forming the layer of silicon at a thickness of 10 Å to 20 Å.

14. The method according to claim 1, comprising forming the silicon carbide layer by:

introducing a wafer having the dielectric layer with the opening therein into a chamber;

introducing trimethyl silane (TMS) and helium (He) into the chamber for a period of time sufficient to stabilize the TMS flow rate and to stabilize the He flow rate subsequently introducing ammonia ($NH_3$); and depositing the silicon carbide layer by plasma enhanced chemical vapor deposition.

15. The method according to claim 14, further comprising:

discontinuing the introduction of TMS, He and $NH_3$ into the chamber;

introducing silane ($SiH_4$) into the chamber; and depositing a layer of silicon on the silicon carbide layer.

* * * * *